United States Patent [19]

Stehlin et al.

[11] 3,897,274

[45] July 29, 1975

[54] METHOD OF FABRICATING DIELECTRICALLY ISOLATED SEMICONDUCTOR STRUCTURES

[75] Inventors: Robert A. Stehlin; Richard J. Dexter; Don L. Kendall; John M. Pankratz, all of Richardson, Tex.

[73] Assignee: Texas Instruments Incorporated, Dallas, Tex.

[22] Filed: Mar. 12, 1973

[21] Appl. No.: 340,484

Related U.S. Application Data

[62] Division of Ser. No. 148,760, June 1, 1971, abandoned.

[52] U.S. Cl. .................................... 148/1.5; 357/91

[51] Int. Cl. ............................................. H01l 7/54

[58] Field of Search ....................... 148/1.5; 317/235

[56] References Cited

UNITED STATES PATENTS

| | | | |
|---|---|---|---|
| 3,457,632 | 6/1969 | Dolan et al. | 148/1.5 X |
| 3,515,956 | 6/1970 | Martin et al. | 148/1.5 X |
| 3,586,542 | 6/1971 | MacRae | 148/1.5 |
| 3,622,382 | 11/1971 | Brack et al. | 148/1.5 X |
| 3,655,457 | 4/1972 | Duffy et al. | 148/1.5 |
| 3,666,548 | 5/1972 | Brack et al. | 148/1.5 UX |
| 3,707,765 | 1/1973 | Coleman | 148/1.5 X |

OTHER PUBLICATIONS

Bean et. al., "The Influnce of Crystal Orientation – Processing", Proc. of IEEE, Vol. 57, No. 9, Sept. 69, pp. 1469–1476.

*Primary Examiner*—L. Dewayne Rutledge
*Assistant Examiner*—J. M. Davis
*Attorney, Agent, or Firm*—Harold Levine; James T. Comfort; Gary C. Honeycutt

[57] ABSTRACT

Various regions or pockets are defined within a substrate that comprises an integral body of semiconductor material. The regions extend to a surface of the substrate and are isolated one from another by dielectric layers that enclose each region, extending to the surface of the substrate around the periphery of each region. In one aspect of the invention the dielectric layer extends to the surface of the substrate at an acute angle thereto. The dielectric layer is formed using ion implantation techniques to implant selected ions to a desired depth in the substrate where they combine with the semiconductor material to form an insulating compound.

10 Claims, 8 Drawing Figures

INVENTORS
Robert A. Stehlin
Richard J. Dexter
Don L. Kendall
John M. Pankratz

BY Richard L Donaldson

ATTORNEY

METHOD OF FABRICATING DIELECTRICALLY ISOLATED SEMICONDUCTOR STRUCTURES

This is a division, of application Ser. No. 148,760, filed June 1, 1971, abandoned.

This invention relates to integrated circuits and more particularly to monolithic circuits of the type having circuit components joined together by a common substrate and which are electrically isolated one from another throughout the substrate.

The increased use of miniaturization has been reflected in the semiconductor field by the rapid development of integrated circuitry, and particularly monolithic integrated circuitry. By monolithic integrated circuitry is meant the formation of individual active and/or passive circuit components for an electronic circuit in or on a single slice of semiconductor material, preferably single crystalline, the components being interconnected to form the desired circuit network. In such a circuit network it is necessary to electrically isolate the circuit components formed on the slice.

Various techniques have been developed for fabricating integrated circuits wherein the individual components are electrically isolated one from another; for example, in one method an epitaxial layer of semiconductor material of one conductivity type is formed upon a substrate of opposite conductivity type and the discrete components are formed in the epitaxial layer. An isolation region is formed by doping the areas surrounding each device with an appropriate impurity typically of a conductivity type the same as the substrate. The device is then heated to an elevated temperature, generally around 1,200°C, for a long period of time. The high temperature creates vacancies in a lattice structure of the epitaxial layer and thus enables the impurity to diffuse through the epitaxial layer and contact the substrate to form the isolation barrier. Several problems are associated with this method, however. First, in diffusing through the epitaxial layer the dopant tends to diffuse in all directions. The lateral spreading of the dopant requires a larger area of the substrate slice for each element formed from that which would be required if the dopant diffused in a vertical direction. Secondly, the high temperature required in order to enable the dopant to diffuse through the epitaxial layer introduces contaminative impurities (such as gold, copper, etc.) into the device and impairs its characteristics. In addition, the resistance of the reverse biased p-n junction is inadequate for many purposes and conditions; for example, in a radiation environment the isolation is severely degraded.

It is therefore an object of the present invention to provide an improved method for fabricating integrated circuits wherein dielectrically isolated semiconductor regions are formed in a semiconductor chip.

An additional object of the invention is to provide a dielectric isolation layer in a semiconductor chip using ion implantation techniques to convert a portion of the semiconductor material to an electrically insulating compound.

A further object of the invention is to provide a dielectric isolation layer that encloses a body of semiconductor material wherein the dielectric layer extends to the surface of the semiconductor chip at an acute angle thereto.

Briefly, and in accordance with the present invention, a plurality of regions adjacent the surface of a semiconductor chip are dielectrically isolated one from the other by a continuous layer of dielectric material that extends to the surface of the chip and forms an acute angle therewith. The dielectric material is formed using ion implantation to implant selected ions a desired distance below the surface of the semiconductor chip. The ions convert a portion of the semiconductor material to an electrically insulating compound. In one aspect of the invention, a silicon chip is utilized and either carbon, nitrogen or oxygen ions are implanted to thereby form silicon carbide, silicon nitride, silicon oxide compounds, or combinational compounds such as $SiO_xN_yC_z$.

In forming an integrated circuit, an ion impervious mask is formed to overlie the surface of the chip. Windows are opened in the chip at selected locations corresponding to the regions which are to be dielectrically isolated. The walls of the openings in the mask are preferably formed so that they are bevelled. An ion beam is then directed to impinge upon the surface of the chip. In the region directly under the exposed surface of the semiconductor chip a dielectric isolation layer is formed after annealing. The layer will be formed a distance below the surface of the chip that corresponds to the energy of the ions. The bevelled walls of the openings reduce the distance that the ions travel into the semiconductor material and thus enables, without varying the energy of the ion beam, a dielectric layer to be formed that extends to the surface of the semiconductor chip, completely dielectrically isolating a pocket of semiconductor material for subsequent circuit element fabrication.

Figure 1:
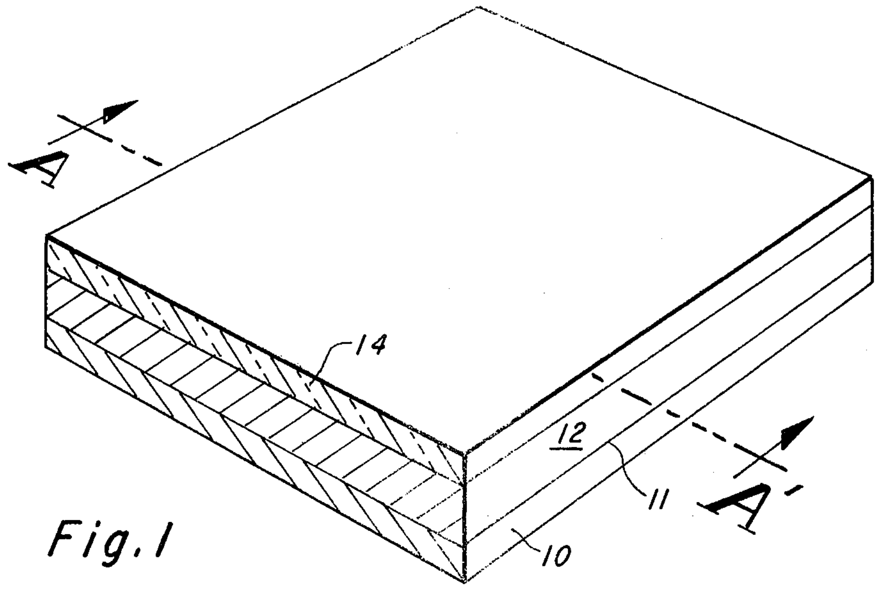
FIG. 1 is a pictorial view partially in section of a portion of a semiconductor slice in the early stages of fabrication of an integrated circuit structure in accordance with the present invention.

Referring now to FIG. 1, a semiconductor chip or bar is shown at 10. In practice, the chip 10 may be a portion of a slice of single crystalline semiconductor material such as silicon. A starting slice may typically be approximately 2 inches in diameter and 10 mils thick, and would contain hundreds of chips, such as 10, each of which corresponds to the region of the slice occupied by one integrated circuit. An epitaxial layer 12 is formed over the top surface 11 of the chip 10. By way of example, an N+ silicon substrate may be utilized an an N epitaxial layer formed thereover. A mask 14 is formed of a material that is substantially impervious to an ion beam. For example, the mask may comprise silicon oxide formed by conventional techniques to a thickness on the order of 10,000 Angstroms. Other masking material such as any of various metals known to those skilled in the art may be utilized, if desired.

Using conventional photolithographic masking and etching techniques or electron beam patterning and etching techniques, a portion of the oxide layer 14 is removed to form windows 16 to expose portions of the surface of the epitaxial layer 12. Preferably, the patterning is effected so that the walls 18 of the window are bevelled. As will be explained hereinafter, bevelling the sides 18 has the advantage of producing a dielectric layer, exhibiting improved isolation characteristics. Masks having bevelled edges are well known in the art. For example, reference Yanagawa et al, "Failure Analysis of Evaporated Metal Interconnections at Contact Windows" *IEEE Transactions on Electron Devices*, Volume Ed-17, No. 11, November 1970, p. 965. Preferably the walls are bevelled to form an angle from 15° tp 60°with the surface.

A beam of ions is directed to impinge upon the surface of the mask 14 and the exposed areas of the epitaxial layer 12. A predetermined ion acceleration voltage is selected to effect implantation at the desired distance below the surface of the epitaxial layer 12. As understood by those skilled in the art, the distance that an ion will travel through a material is proportional to the accelerating energy. In accordance with the present invention, ions are selected that are effective to form an insulating compound with the semiconductor material. For example, when silicon is utilized as the semiconductor material, ions of oxygen, nitrogen or carbon are preferably utilized. Thus, upon implantation in the silicon material and annealing nitrogen ions, for example, convert a portion of the silicon to silicon nitride. Similarly, carbon ions form silicon carbide and oxygen ions form silicon oxide. These compounds are all electrically insulating. A sufficient dose of ions is implanted to effect conversion of a significant number of silicon atoms to the insulating compound. For example, when nitrogen ions are implanted into silicon material, a dose of $10^{17}$ or greater ions/$cm^2$ is sufficient to form a dielectric isolation layer having a resistivity greater than $10^{12}$ ohm-cm.

Figure 2:
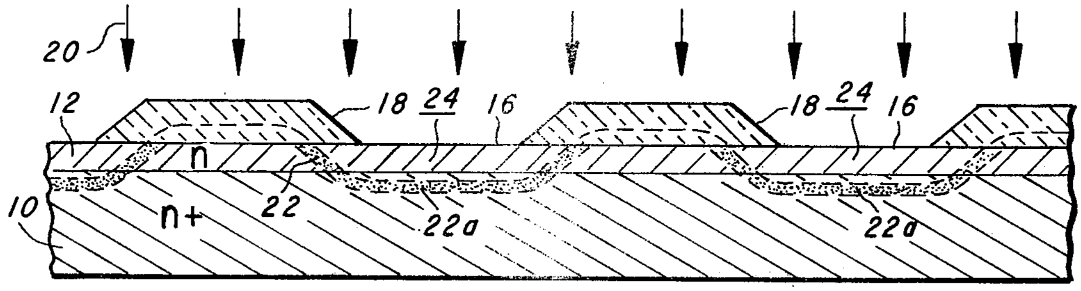
FIG. 2 is a sectional view taken along the line A—A' of FIG. 1, illustrating steps for forming a dielectric isolation layer in accordance with the present invention.

With reference to FIG. 2, an ion beam is illustrated generally by the arrows 20. The speckled area 22 schematically illustrates the dielectric layer formed by the compound comprising the implanted ions and the semiconductor material. For the situation illustrated in FIG. 2, the ion beam 20 has sufficient energy to penetrate the semiconductor material in regions where windows have been opened in the mask and thereby form a dielectric layer beneath the surface 11 of the chip 10. For those regions of the surface 11 where no mask at all remains, a dielectric layer 22*a* is formed below the surface 11 and substantially parallel thereto. At the periphery of the region of 22*a*, the dielectric area slopes upward to the surface 11 of the epitaxial layer 12. It may be seen that this sloping portion corresponds to the bevelled portion 18 of the mask 14. That is, in regions where the mask 14 is at a maximum thickness, ion penetration is completely arrested. In the sloped region 18, however, a varying portion of the ion beam penetrates through the mask into the semiconductor material thereunder; the thinner the mask the deeper into the semiconductor material the ions penetrate. This is effective to form a sloping dielectric layer which extends from the surface 11 of the epitaxial layer 12 downward to contact the lowermost portion 22*a* of the dielectric layer. This in essence forms a pocket 24 of dielectrically isolated semiconductor material. The advantage in forming the sloping region of the dielectric layer is the fact that improved dielectric isolation is obtained. For example, if the mask 14 were not formed to have the bevel 18, but rather were formed to have an abrupt or substantially perpendicular side wall, the thickness of the epitaxial layer 12 would be very thin and in many cases would not exhibit satisfactory isolation characteristics. In other words, the side walls of the pocket of dielectric isolation would exhibit substantially less dielectric isolation capabilities than the lowermost portion of 22*a*.

As understood by those skilled in the art, any of various electronic elements may be formed in the region 24 of the wafer 10 and such elements will be electrically insulated from other regions of the chip 10 similar to the region 24.

Figure 3:
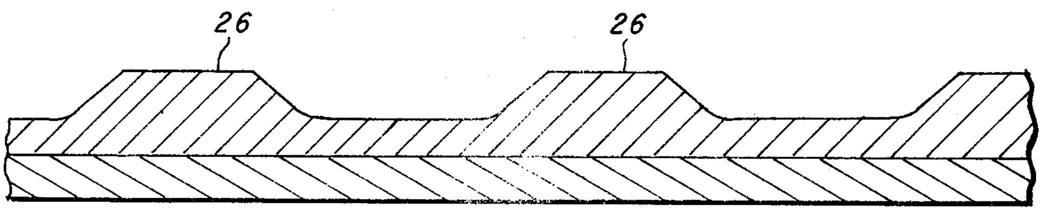
FIG. 3 is a sectional view along the line A—A' of FIG. 1 illustrating steps for producing mesas on a portion of the surface of the semiconductor chip.

With reference to FIG. 3, a method in accordance with the present invention for forming mesas at preselected locations on the surface of the semiconductor chip will be described. Mesas are shown generally at 26 and may be formed starting with the structure illustrated in FIG. 2. It may be seen that by removing the mask 14, the dielectric isolation layer 22, and the semiconductor material 24, that the structure shown in FIG. 3 may be produced. Etchants effective to selectively etch, for example, silicon and not an insulating material such as silicon nitride, and vice versa, are well-known to those skilled in the art. Where the structure comprises silicon with an insulating mask of silicon oxide and a dielectric layer of silicon oxide, the silicon material 24 may be removed, for example, by etching in a solution of KOH and water. The silicon oxide is also etched in this solution, but at a much slower rate than the silicon, so the etching time is adjusted to substantially remove only the silicon in the pocket. The silicon oxide mask and the silicon oxide dielectric layer may then be removed by etching in hydrofluoric acid, producing the structure shown in FIG. 3. Alternatively, where the dielectric layer comprises silicon nitride, phosphoric acid may be utilized to selectively etch the dielectric layer, leaving the desired semiconductor structure having mesas at selected locations.

Figure 4:
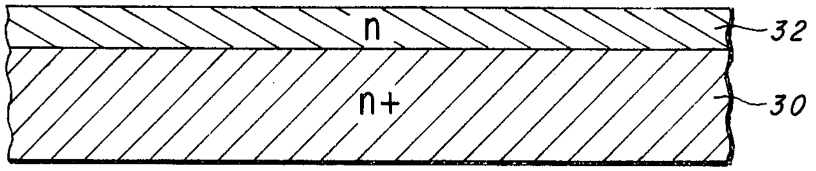
FIGS. 4–6 are sectional views of a portion of a semiconductor wafer illustrating steps in forming a dielectric isolation layer in accordance with a different embodiment of the present invention.
Figure 5:
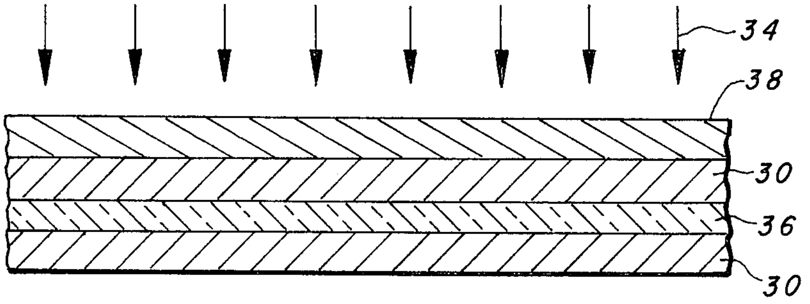
Figure 6:
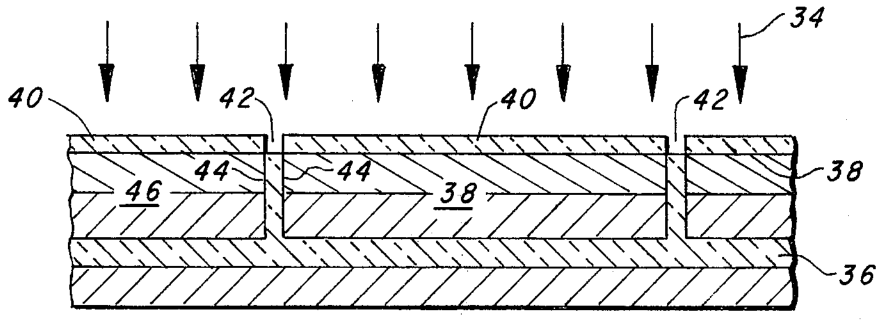

With reference to FIGS. 4–6, a different embodiment of the present invention will be described. A portion of a semiconductor chip is shown generally at 30. This material may, for example, comprise N+ silicon. An epitaxial layer 32 of, for example N-type silicon may be grown over the chip 30. Preferably, the epitaxial layer is formed to a thickness of 0.08 mils or less and the total thickness of the epitaxial layer 32 and the wafer 30 is typically in the range of 8 to 10 mils. An ion beam, shown generally by the arrows 34, is directed so as to impinge upon the exposed surface of the epitaxial layer 32. The ion beam is accelerated to a preselected energy and a preselected dosage is utilized to form a dielectric insulating layer 36 under the surface 38 of the chip 30. With silicon used as the semiconductor material, the ions are preferably either carbon ions, oxygen ions or nitrogen ions or some combination thereof. Thus, as illustrated in FIG. 5, a dielectric insulating layer 36 extends across the entire wafer 30 or in prescribed broad areas of the slice a preselected distance under the surface 38 of the wafer 30 and substantially parallel to the surface 38. The implanted ions form an insulating compound with the silicon where the structure is heated to a temperature above 700°C for a short period of time. The substrate may be heated during implantation so that the compound is formed at the time of implantation, if desired.

With reference to FIG. 6, a mask 40 is formed over the exposed surface of the epitaxial layer 32 to a thickness sufficient to prevent ion beam penetration into the semiconductor material. When silicon oxide is used as the mask, a thickness of 10,000 Angstroms, for example, is sufficient to prevent penetration of ions accelerated by a voltage in the order of 150 KV. The mask may be thermally grown by heating the silicon in the presence of oxygen, as well-known by those skilled in the art. Also a low temperature deposition process may be used to form a suitable mask, e.g., plasma deposited nitride near room temperature, or silane deposited oxide, at 400°C. Windows 42 are opened in the mask 40 at positions where a dielectric isolation layer that extends to the surface of the chip is desired. In the next step, a beam of ions 34 is again directed to impinge upon the surface of the structure. The mask 40 prevents ion penetration in all areas except through the windows 42. The accelerating voltage of the ion beam 34 is varied through a range so that the depth that the ions are implanted into the semiconductor material varies from a depth at least equal to the depth of the dielectric layer 36 and through progressively less depths so as to extend the dielectric layer to the surface of the epitaxial layer 38. Thus, it may be seen that a continuous dielectric isolation layer may be formed to completely enclose a region of semiconductor material.

The above-described method for forming the dielectric isolation layer is preferred where extremely high packing density is required. High density may be obtained since there is substantially no lateral diffusion during ion implantation. In other words, the walls 44 of the dielectric isolation layer are essentially vertical. Thus, adjacent dielectrically isolated regions shown generally at 46 and 38 may be formed extremely close together. This is in contrast to conventional diffusion techniques where lateral diffusion necessitates that adjacent regions be formed further apart so that sufficient isolation may be obtained, thus requiring a larger portion of the available area of a semiconductor chip for each circuit element.

Alternatively, lateral isolation of regions may be provided by diffused p-n junctions, for example, in conjunction with the dielectric isolation layer 36. In addition, if lower ion accelerating voltages are desired or if extremely thick regions of semiconductor material are to be isolated, the dielectric layer 36 may be formed prior to forming the epitaxial layer 32, or after a relatively thin epitaxial layer 32 is formed. The structure may then be placed in a reactor and a portion of the epitaxial layer is grown. The structure is then removed and ion implantation is effected as above described to form the lateral dielectric isolation regions to extend the isolation to the surface of the epitaxial region. This process is repeated until the desired thickness of epitaxial material is achieved. It is to be appreciated, however, that care must be exercised to maintain alignment between successive implants. Alignment techniques are known to those skilled in the art and need not be described in detail herein.

EXAMPLE

Ionized atomic nitrogen was implanted in a silicon substrate at 150 KEV with a total dose of $1 \times 10^{16}$ ions per square centimeter. The slice was subsequently annealed in a nitrogen atmosphere for about 30 minutes at 900°C. A buried dielectric layer was formed at a depth of about 0.3 microns with a width of about 0.1 microns. The silicon layer at the surface was relatively undamaged as shown by X ray defraction techniques and by growing several microns of single crystal epitaxial material on the surface.

Figure 7:
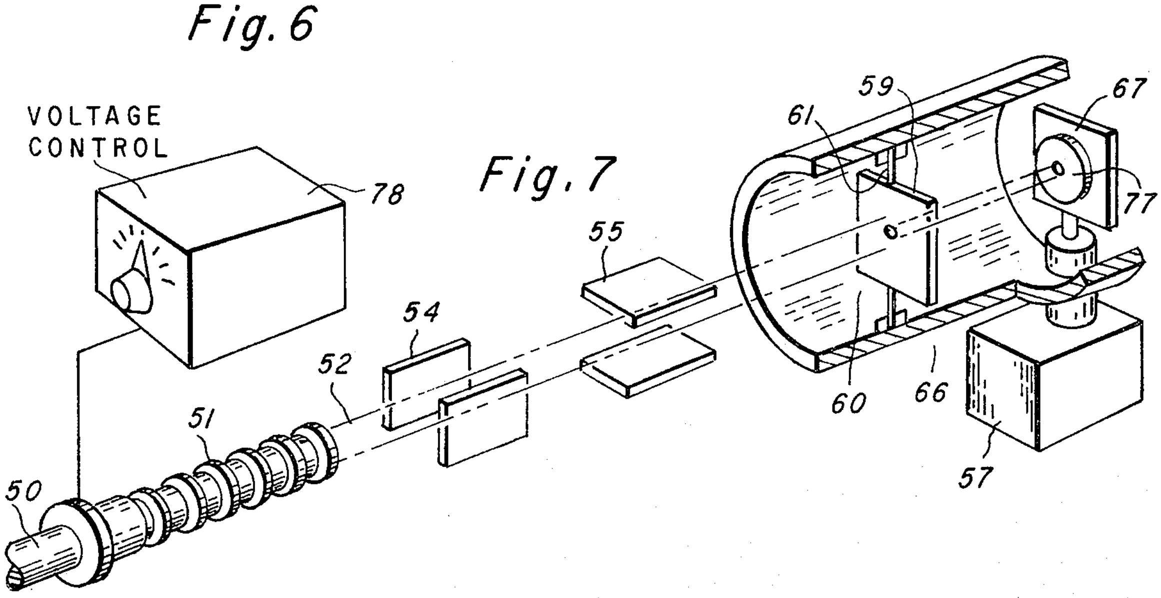
FIG. 7 is a pictorial illustration of apparatus by which the method of the present invention may be practices.

With reference to FIG. 7, there is depicted apparatus by which the ion implantation steps of the present invention may be practiced. The apparatus basically comprises an ion source 50 mounted at one end of an accelerator tube 51. Ions, in the form of a beam 52, emerge from the accelerator tube and pass through a deflection system which may be comprised of horizontal scanner plates 54 and vertical scanner plates 55. This deflection system is used to direct the beam such that it is focused on a plate 59 which has a suitably dimensioned aperture 60 therein. This plate is rigidly held in an evacuated chamber 66 between the slice 77, which may, for example, comprise a plurality of the chips 10 illustrated in FIGS. 1–6, and the ion source 50 by a suitable fixture 61. The sample holder 67, upon which the slice 77 is mounted, is fixed to an indexing assembly 57 which moves the assembly so that only one portion of the surface of the slice 77 is exposed to the beam which passes through the aperture 60.

The indexing system in conjunction with the aperture permits precise control of the ion beam, enabling bombardment of discrete selected areas of the surface of the slice 77. Such control assures that when the ion current passing through the aperture and impinging on the slice is maintained constant, each irradiated portion of the slice receives exactly the same intensity of radiation. Alternatively, the current passing through the aperture may be integrated using a commercially available electrometer device and the slice indexed after a predetermined charge is impinged upon the specified are of the slice surface. The ion source 50 and accelerator tube 51 may comprise a relatively high energy ion beam accelerator from about 1,000 volts to several million electron volts. Means for varying the accelerating energy are shown in block diagram form at 78. Such voltage regulator means are known to those skilled in the art and need not be described in more detail herein.

Figure 8:
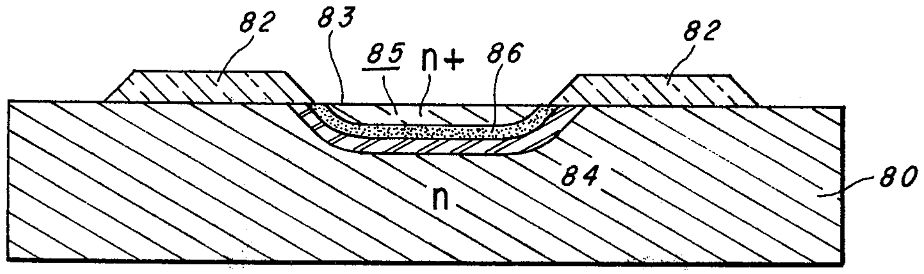
FIG. 8 is a sectional view illustrating a different embodiment of the invention.

With reference to FIG. 8 a different embodiment of the invention is illustrated wherein a substrate 80 of, e.g., n-type silicon is used as the starting material. If desired, the substrate 80 could, of course, be an epitaxial layer. In a manner as described with reference to FIG. 2, a bevelled mask 82 is formed over the surface 83 of the substrate and a dielectric layer 84 is then formed by implanting ions of $O_2$, $N_2$, C or some combination thereof. The implanted ions form an insulating compound when the structure is heated to a temperature of, e.g., at least 700°C for a short period of time, i.e., 10 minutes or longer. Due to the bevelled edges of the mask, the dielectric layer 84 will extend to the surface 83 of the substrate, isolating a pocket of silicon such as shown generally at 85. Since it is desirable in many applications to have a high conductivity region extending to the surface of the isolated pocket around the periphery thereof, an N+ region 86 (assuming an N-type substrate 80) may be formed by ion implantation using the same bevelled mask used to form the dielectric layer 84. Similarly, an N+ region extending to the surface of the substrate could be formed in the structure illustrated in FIG. 6 by implanting appropriate ions through a patterned mask. Also, is should be understood that, e.g., in the structure shown in FIG. 6, N+ diffusions could advantageously be effected to form an N+ region extending from the surface through the epitaxial layer 32 into contact with the N+ substrate 30.

While specific embodiments of the present invention have been described herein, various modifications to the details of construction may be made without departing from the scope or spirit of the invention.

For example, by orienting the substrate very closely along one of the low index planes such as the {100}, {110}, or {111}, the channeling effect will allow the dielectric layer to be formed at a considerably larger depth for a given acceleration energy. For instance, the depth that $N^{+1}$ will channel in the <110> direction at an energy of 150 KEV is approximately 3.0 microns instead of approximately 0.3 microns in a random crystal direction. Also, a reusable shadow mask could be utilized if desired to reduce process steps required by forming masks on the substrate surface.

What is claimed is:

1. A method for forming a buried dielectric isolation layer in a semiconductor body comprising the steps of:
selecting a semiconductor body crystallographically oriented to expose a surface lying in a low index plane;
forming a mask substantially impervious to ion radiation over said semiconductor surface;
opening windows through said mask at selected locations; and
directing a beam of ions to impinge upon said windows, said ions being accelerated by an energy sufficient to implant said ions in a layer a desired distance below the surface of said semiconductor material in said layer to an electrically insulating compound.

2. A method for forming a dielectric isolation layer as set forth in claim 1, wherein said semiconductor material is silicon and said ions are selected from the group consisting of carbon, nitrogen and oxygen.

3. A method for forming a dielectric isolation layer as set forth in claim 1, wherein said windows are formed to have bevelled walls.

4. A method for forming a buried dielectric isolation layer in a semiconductor chip comprising the steps of:
a. growing a relatively thin epitaxial layer over a semiconductor chip;
b. directing a beam of accelerated ions over the surface of said epitaxial layer to form a dielectric layer substantially parallel to the surface of said epitaxial layer and buried within said semiconductor chip a predetermined distance under the surface of said epitaxial layer, said ions converting a portion of said semiconductor chip to an electrically insulating compound;
c. forming an ion impervious mask over the surface of said substrate;
d. opening windows in said mask at preselected locations;
e. directing a beam of ions to impinge upon said windows to implant said ions a selectable distance into said semiconductor chip to contact said buried layer; and
f. varying the acceleration energy of said ions to extend said dielectric layer to the surface of said epitaxial layer under said windows thereby forming a plurality of dielectrically isolated regions in said semiconductor chip.

5. The method for forming a dielectric isolation layer as set forth in claim 4, wherein said ions are selected from the group consisting of carbon, nitrogen and oxygen and said semiconductor material is silicon.

6. A method for producing a dielectrically isolated layer as set forth in claim 5, wherein said windows have bevelled walls.

7. A method for forming a buried dielectric isolation layer as set forth in claim 4 including the step of heating the structure subsequent to implantation of said ions to a temperature of at least 700°C to enhance formation of said insulating compound.

8. A method for forming a buried dielectric layer as set forth in claim 4 wherein the steps of implanting ions includes simultaneously heating said semiconductor chip to a temperature of at least 700°C.

9. A method for forming a buried dielectric layer as set forth in claim 4 wherein said substrate is oriented along a low index crystalline plane to enhance channeling of said implanted ions.

10. A method for forming a buried dielectric layer as set forth in claim 4 including the step of forming a high conductivity layer contacting the upper surface of said dielectric layer and extending to the surface of said semiconductor chip.

* * * * *